(12) United States Patent
Choe

(10) Patent No.: US 6,906,556 B2
(45) Date of Patent: Jun. 14, 2005

(54) HIGH-SPEED DOMINO LOGIC WITH IMPROVED CASCODE KEEPER

(75) Inventor: Swee Yew Choe, Milpitas, CA (US)

(73) Assignee: Sun Microsystems, Inc., Santa Clara, CA (US)

(*) Notice: Subject to any disclaimer, the term of this patent is extended or adjusted under 35 U.S.C. 154(b) by 0 days.

(21) Appl. No.: 10/611,134

(22) Filed: Jun. 30, 2003

(65) Prior Publication Data

US 2004/0263209 A1 Dec. 30, 2004

(51) Int. Cl.⁷ .......................................... H03K 19/096
(52) U.S. Cl. ............................ 326/95; 326/96; 326/97; 326/98
(58) Field of Search ..................................... 326/95–98

(56) References Cited

U.S. PATENT DOCUMENTS

| | | | |
|---|---|---|---|
| 4,247,791 A | 1/1981 | Rovell | 307/238 |
| 5,859,548 A | 1/1999 | Kong | 326/113 |
| 6,028,454 A | 2/2000 | Elmasry et al. | 326/115 |
| 6,211,704 B1 | 4/2001 | Kong | 326/121 |
| 2004/0104744 A1 * | 6/2004 | Bosshart | 326/95 |

OTHER PUBLICATIONS

Choe et al., "Dynamic Half Rail Differential Logic for Low Power", IEEE 1997, pp. 1936 to 1939.

Jung et al., "Modular Charge Recycling Pass Transistor Logic (MCRPL)", Electronics Letters, Mar. 2, 2000 vol. 36 No. 5, pp. 404 to 405.

Kong et al., "Charge Recycling Differential Logic for Low-Power Application", ISSC96 secession 18, IEEE 0–780331962/98, 1998, pp. 302 to 448.

Choe et al., "Half Rail Differential Logic", ISSCC97/Secession 25/Processors and Logic/Paper SP 25.6 IEEE 0–7803–3721–2/97, 1997, pp. 420 to 421, 336 to 337 and 489.

Won et al., "Modified Half Rail Differential Logic for Reduced Internal Logic Swing", IEEE 0–7803–4455–3/98, 1998, pp. II–157 to II–160.

Kong et al., "Charge Recycling Differential Logic (CRDL) for Low–Power Application", IEEE Journal of Solid–State Circuits, vol. 31, No. 9, Sep. 1996, pp. 1267 to 1276.

* cited by examiner

*Primary Examiner*—Anh Q. Tran
(74) *Attorney, Agent, or Firm*—Gunnison, McKay & Hodgson, L.L.P.; Philip J. McKay

(57) ABSTRACT

A high-speed domino logic with improved cascode keeper circuit uses an inverter delay element and an additional transistor to introduce a transition delay time and node isolation time to avoid the contest or "fight" between a first node and the keeper transistor in the event of a path to ground being created through the logic block portion of high-speed domino logic with improved cascode keeper circuit. The high-speed domino logic with improved cascode keeper circuits of the invention, in contrast to prior art domino logic circuits, can be designed to have high noise immunity and increased speed. In addition, since according to the invention, only a minimum of one new inverter and one new are required, the modification of the invention is space efficient and readily incorporated into existing designs.

21 Claims, 3 Drawing Sheets

HIGH-SPEED DOMINO LOGIC WITH IMPROVED CASCODE KEEPER

FIELD OF THE INVENTION

The present invention relates generally to logic circuits and, more particularly, to domino logic circuits.

BACKGROUND OF THE INVENTION

FIG. 1 shows a schematic diagram of one embodiment of a typical prior art domino logic circuit 100. As seen in FIG. 1, prior art domino logic circuit 100 included a first supply voltage 101, typically Vdd, coupled to a source, or first flow electrode 111, of a PFET 110 and a source, or first flow electrode 121 of a PFET 120, also known as a keeper transistor. The signal CLK was coupled to a control electrode or gate 115 of PFET 110 and a control electrode or gate 135 of an NFET 130. A drain, or second flow electrode 113, of PFET 110 was coupled to a first node 190. A drain, or second flow electrode 123, of PFET 120 was also coupled to first node 190 and an input terminal 107 of an inverter 105. An output terminal 109 of inverter 105 was coupled to a control electrode or gate 125 of PFET 120 and a prior art domino logic circuit out terminal 151.

Node 190 was coupled to an input terminal 102 of a logic block 103. Logic block 103 was comprised of any one of numerous types of logic and/or circuitry used in the art including various logic gates, logic devices and circuits such as transistors, inverters and other logic functions, both simple and complex, well known to those of skill in the art, and too numerous to list comprehensively herein. Logic block 103 also included inputs at input terminals 104 and an output terminal 108. Output terminal 108 of logic block 103 was coupled to a drain, or first flow electrode 131 of NFET 130. A source, or second flow electrode 133 of NFET 130 was coupled to a second supply voltage 106, typically ground.

For illustrative purposes specific embodiments of prior art domino logic circuit 100 were shown with specific transistors. However, the NFETs and PFETS shown in the FIG. 1 can be readily exchanged for PFETs and NFETs by reversing the polarities of the supply voltages or by other well known circuit modifications.

Prior art domino logic circuit 100 had two modes, or phases, of operation; a pre-charge phase and an evaluation phase. In one embodiment of prior art domino logic circuit 100, in the pre-charge phase; the signal CLK was low or a digital "0". Consequently, PFET 110 was conducting or "on"; PFET 120 was on and NFET 130 was off, thereby isolating logic block 103 from second supply voltage 106. In addition, during the pre-charge phase, first node 190 was high, or a digital "1", and this state was reinforced by PFET 120 being in the on state. In addition, during the pre-charge phase, prior art domino logic circuit output terminal 151 was low or digital "0".

In the following discussion, assume that in the previous cycle, there was a path 191 from node 190 to second supply voltage 106 through logic block 103. In the evaluation phase, the signal CLK was high or a digital "1". Consequently, PFET 110 was not conducting or "off"; PFET 120 was on; and NFET 130 was on, thereby providing logic block 103 a path to second supply voltage 106. In addition, during the evaluation phase, first node 190 was low, or a digital "0" and prior art domino logic circuit output terminal 151 was high or digital "1".

Prior art domino logic circuit 100 functioned reasonably well in either low speed environments or low noise environments, however, prior art domino logic circuit 100 did not perform well in high speed and high noise applications. This was because, with prior art domino logic circuit 100, the transition from the pre-charge phase to the evaluation phase involved an inherent problem regarding first node 190 and PFET 120. This problem arose because, as discussed above, in the pre-charge phase, first node 190 of prior art domino logic circuit 100 was held at a digital "1" and prior art domino logic circuit output node 151 was a digital "0", which reinforced the digital "1" on first node 190 by keeping PFET 120 on. At the transition from pre-charge to evaluation phase, the signal CLK goes to a digital "1" and NFET 130 is turned on, consequently, logic block 103 is provided with a path to second source voltage 106. If, as was often the case in many instances and types of logic used in logic block 103, logic block 103 also provided a path to NFET 130 at this time, i.e., logic block 103 was also "on", then a path 191 from first node 190 (FIG. 1) to second supply voltage 106, typically ground, through logic block 103 and NFET 130 was established. Once path 191 was established, first node 190 should have dropped to a digital "0" as rapidly as possible to avoid delays in operation of prior art domino logic circuit 100. However, in this same time frame, PFET 120 was still transitioning to the off state, i.e., was still on, and this meant that PFET 120 was still trying to hold first node 190 at first supply voltage 101, i.e., at a digital "1". Consequently, in prior art domino logic circuit 100 there was an inherent "fight" between first node 190, trying to discharge to "0" and PFET 120 trying to hold first node 190 at "1" during the transition between pre-charge and evaluation. This fight resulted in a significant delay in the operation of prior art domino logic circuit 100.

To try and minimize this effect, i.e., the delay, resulting from the "fight" between first node 190, trying to discharge to "0" and PFET 120 trying to hold first node 190 at "1" during the transition between pre-charge and evaluation, most circuit designers employed a PFET 120 with the smallest possible channel dimensions, i.e., PFET 120 was intentionally made small, and therefore weak, so that PFET 120 would hold node 190 high for as short a time as possible. In other words, PFET 120 was made weak and small so it would lose its fight with first node 190 quickly. Unfortunately, this solution had significant drawbacks. In particular, by making PFET 120 small, the noise immunity of prior art domino logic circuit 100 was compromised and this could lead to total failure of prior art domino logic circuit 100 in high noise environments.

Employing a weak PFET 120 in prior art domino logic circuit 100 was particularly problematic in instances where logic block 103 did not provide a path to NFET 130 and second supply voltage 106. In these instances, first node 190 must remain high. However, if noise was introduced at input terminals 104 of logic block 103, this noise could cause logic block 103 to provide a temporary path to NFET 130 and second supply voltage 106. In this case, first node 190 could discharge to ground, i.e., first node 190 could go low in error, and there was no mechanism to ever bring first node 190 back to high or digital "1". Consequently, under these circumstances, prior art domino logic circuit 100 would fail unrecoverably.

As a result of the situation discussed above, designers of prior art domino logic circuit 100 were constantly involved in a balancing act between minimizing the size and strength of PFET 120, to increase speed of prior art domino logic circuit 100, and increasing the size and strength of PFET 120, to make prior art domino logic circuit 100 more robust and noise immune. The result was that prior art domino logic circuit 100 functioned reasonably well in either low speed environments or low noise environments, however, prior art domino logic circuit 100 did not perform well in high speed and high noise applications.

What is needed is a method and apparatus for creating an improved domino logic circuit that is capable of operation in both high speed and high noise environments.

SUMMARY OF THE INVENTION

The present invention is directed to a method and apparatus for creating an improved domino logic circuit that is capable of operation in both high speed and high noise environments.

The high-speed domino logic with improved cascode keeper circuit of the invention uses an odd number of inverters, i.e., one, three, five, seven, etc. inverters, and an additional transistor to introduce a transition delay time and node isolation time to avoid the fight between the first node and the keeper transistor described above.

According to the invention, the odd number of inverters create an inverted and delayed clock signal CLKDBAR that remains a digital "0" for a programmed delay time, i.e., a one, three, five, seven etc. inverter delay time, while signal CLK immediately transitions to a digital "1". During this delay time between when signal CLK goes to a digital "1" and the delayed signal CLKDBAR changes state, the keeper transistor is isolated from the first supply voltage by the new transistor being off. Consequently, the keeper transistor does not resist, compete or "fight" the discharge of the first node to a digital "0" when there is a path from the first node to the second supply voltage.

Since, according to the invention, the keeper transistor does not resist, compete or "fight" the discharge of the first node when there is a path from the first node to the second supply voltage, circuit designers are free to use larger and more powerful second transistors. This, in turn, means that the high-speed domino logic with improved cascode keeper circuits of the invention, in contrast to prior art domino logic circuits, can be designed to have high noise immunity and increased speed.

In addition, since according to the invention, as few as one new inverter and one new transistor are required, the modification of the invention is space efficient and readily incorporated into existing designs.

It is to be understood that both the foregoing general description and following detailed description are intended only to exemplify and explain the invention as claimed.

BRIEF DESCRIPTION OF THE DRAWINGS

The accompanying drawings, which are incorporated in, and constitute a part of this specification, illustrate embodiments of the invention and, together with the description, serve to explain the advantages and principles of the invention. In the drawings.

DETAILED DESCRIPTION

The invention will now be described in reference to the accompanying drawings. The same reference numbers may be used throughout the drawings and the following description to refer to the same or like parts.

Figure 2:
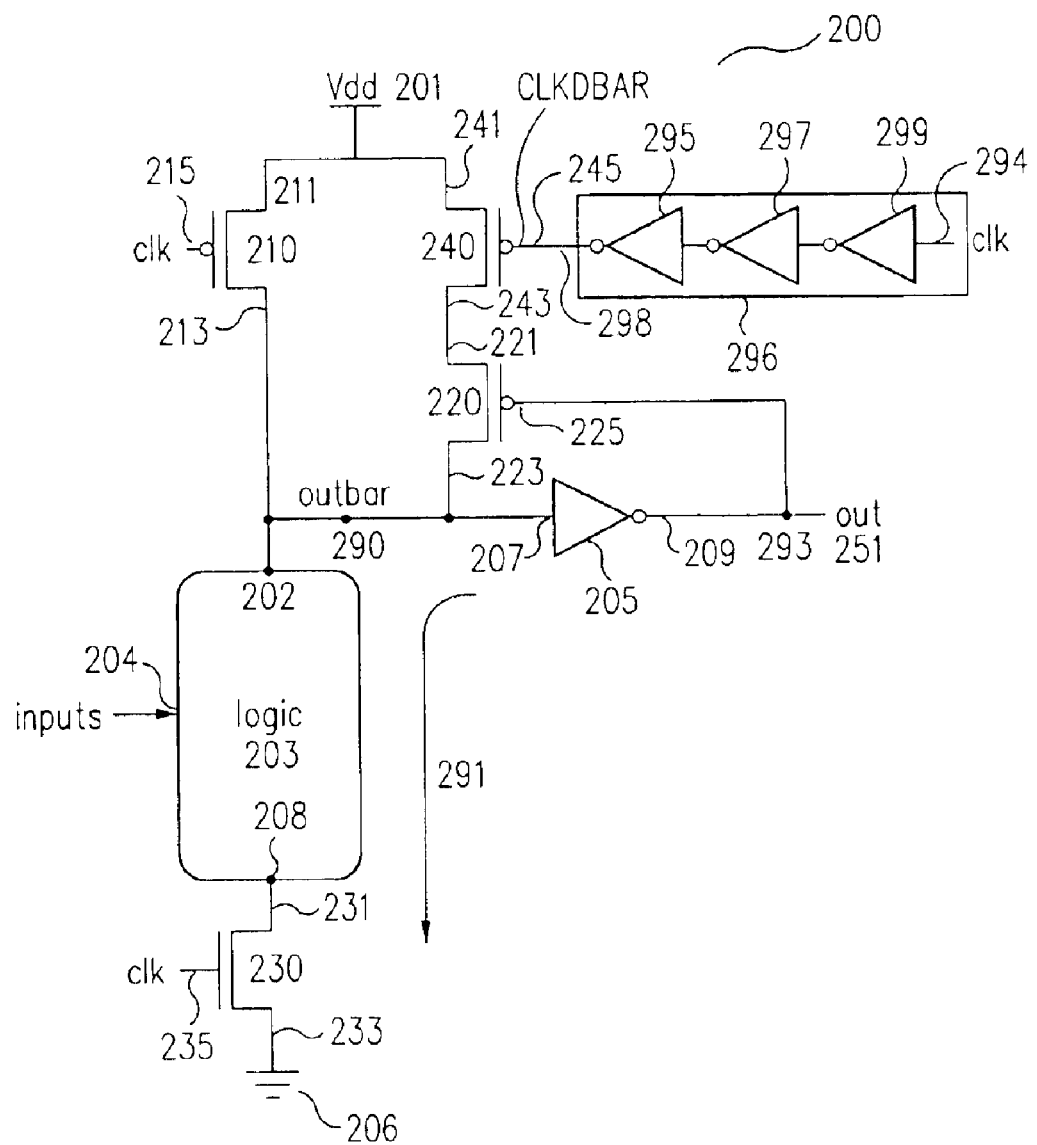
FIG. 2 shows a schematic diagram of one embodiment of a high-speed domino logic with improved cascode keeper designed according to the principles of the present invention.

The high-speed domino logic with improved cascode keeper circuit (200 in FIG. 2) of the invention uses an odd number of inverters (295, 297, 299 in FIG. 2), i.e., one, three, five, seven, etc. inverters, and an additional transistor (240 in FIG. 2) to introduce a transition delay time and node isolation time to avoid the fight between the first node (290 in FIG. 2) and the second, or keeper, transistor (220 in FIG. 2).

Figure 3:
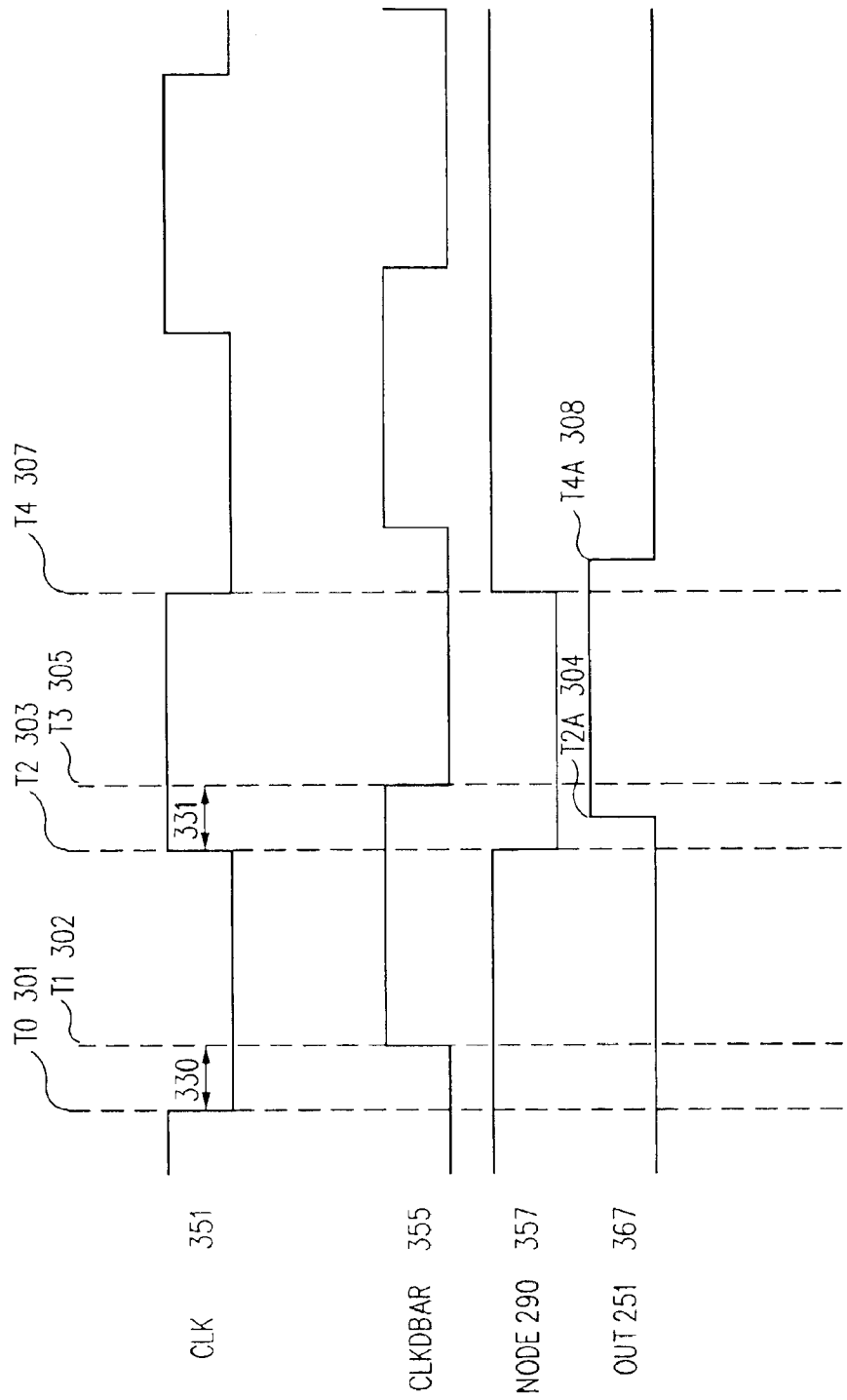
FIG. 3 is a one embodiment of a timing diagram for the high-speed domino logic with improved cascode keeper circuit of the invention shown in FIG. 2.

According to the invention, the odd number of inverters create a delayed clock signal CLKDBAR (355 in FIG. 3) that remains a digital "1" for a programmed delay time (330, 331 in FIG. 3), i.e., a one, three, five, seven etc. inverter delay time, while signal CLK immediately transitions to a digital "1" (303 in FIG. 3). During this delay time between when signal CLK goes to a digital "1" and the delayed signal CLKDBAR changes state, the second, or keeper, transistor 9220 in FIG. 2) is isolated from the first supply voltage (201 in FIG. 2) by the new transistor (240 in FIG. 2) being off. Consequently, the second, or keeper, transistor (220 in FIG. 2) does not resist, compete or "fight" the discharge of the first node (290 in FIG. 2) to a digital "0" when there is a path (291 in FIG. 2) from the first node to the second supply voltage (206 in FIG. 2).

Since, according to the invention, the second, or keeper, transistor does not resist, compete or "fight" the discharge of the first node when there is a path from the first node to the second supply voltage, through the logic block (203 in FIG. 2), circuit designers are free to use larger and more powerful second transistors. This, in turn, means that the high-speed domino logic with improved cascode keeper circuits of the invention, in contrast to prior art domino logic circuits, can be designed to have high noise immunity and increased speed.

In addition, since according to one embodiment of the invention, as few as one new inverter and one new transistor are required, the modification of the invention is space efficient and readily incorporated into existing designs.

FIG. 2 shows a schematic diagram of one embodiment of a high-speed domino logic with improved cascode keeper circuit 200 of the invention. As discussed in more detail below, according to the invention, an inverter delay element 296 is employed to create a delayed clock signal CLKDBAR. Those of skill in the art will recognize the number of inverters (295, 297, 299 in FIG. 2) used in inverter delay element 296 can be varied to meet the needs of the application. However, in one embodiment of the invention, an odd number of inverter is typically required to ensure signal CLKDBAR is out-of-phase with signal CLK.

As seen in FIG. 2, high-speed domino logic with improved cascode keeper 200 includes a first supply voltage 201, in one embodiment Vdd, coupled to a first flow electrode 211, of a first transistor 210 and a first flow electrode 241 of a fourth transistor 240, also known as a new, or additional, transistor. The signal CLK is coupled to a control electrode 215 of first transistor 210 and a control electrode 235 of a third transistor 230. A second flow electrode 213 of first transistor 210 is coupled to a first node 290. A second flow electrode 223 of a second, or keeper, transistor 220 is also coupled to first node 290 and an input terminal 207 of an inverter 205. An output terminal 209 of inverter 205 is coupled high-speed domino logic with improved cascode keeper circuit OUT terminal 251.

First node 290 is coupled to an input terminal 202 of a logic block 203. Logic block 203 is comprised of any one of numerous types of logic and/or circuitry used in the art including various logic gates, logic devices and circuits such as transistors, inverters and other logic functions, both simple and complex, well known to those of skill in the art, and too numerous to list comprehensively herein. Logic block 203 also includes inputs at input terminals 204 and an output terminal 208. Output terminal 208 of logic block 203 is coupled to a first flow electrode 231 of third transistor 230. A second flow electrode 233 of third transistor 230 is coupled to a second supply voltage 206, in one embodiment ground.

As also shown in FIG. 2, high-speed domino logic with improved cascode keeper circuit 200 also includes fourth, or new, or additional, transistor 240 and an inverter delay element 296, with inverter delay element input terminal 294 and inverter delay element output terminal 298. As seen in FIG. 2, a first flow electrode 241 of fourth transistor 240 is coupled to first supply voltage 201 and the delayed clock signal CLKDBAR on inverter delay output terminal 298 of inverter delay element 296 is coupled to control electrode 245 of fourth transistor 240. Second flow electrode 243 of fourth transistor 240 is coupled to a first flow electrode 221 of second transistor 220. In addition, the signal CLK is coupled to inverter delay element input terminal 294.

As shown in FIG. 2, in one embodiment of the invention, first transistor 210, second transistor 220, and fourth transistor 240 are PFETs, while third transistor 230 is an NFET. In this embodiment of the invention first supply voltage 210 is Vdd and second supply voltage 206 is ground. In addition, in this embodiment of the invention, first flow electrodes 211, 221, 233, and 241 are source electrodes and second flow electrodes 213, 223, 231, and 243 are drain electrodes. However, those of skill in the art will recognize that specific embodiments of high-speed domino logic with improved cascode keeper 200 are shown in FIG. 2 with specific transistors for illustrative purposes only and that the NFETs and PFETS shown in the FIG. 2 can be readily exchanged for PFETs and NFETs by reversing the polarities of the supply voltages 201 and 206 or by other well known circuit modifications.

In operation, high-speed domino logic with improved cascode keeper circuit 200 has two modes, or phases, of operation; a pre-charge phase and an evaluation phase. In one embodiment of high-speed domino logic with improved cascode keeper circuit 200, in the initial pre-charge phase, the signal CLK is low or a digital "0". Consequently, first transistor 210 is conducting or "on"; signal CLKDBAR is "1" or a digital high; fourth transistor 240 is off; second transistor 220 is isolated from first supply voltage 201 by fourth transistor 240 being off; and third transistor 230 is off, thereby isolating logic block 203 from second supply voltage 206. In addition, during the pre-charge phase, first node 290 is high, or a digital "1". In addition, during the pre-charge phase, prior art domino logic circuit OUT terminal 251 is low or digital "0".

According to the invention, delayed clock signal CLKDBAR is used in conjunction fourth transistor 240 to avoid the fight between node 290 and second transistor 220. As discussed in more detail below with respect to FIG. 3, when high-speed domino logic with improved cascode keeper circuit 200 switches to the evaluation phase, i.e., signal CLK switches to a digital "1", delayed clock signal CLKDBAR, according to the invention, remains a digital "1" for a programmed delay time, i.e., the delay time provided by inverter delay element 296 and inverters 295, 297 and 299, while signal CLK immediately transitions to a digital "1". During this delay time between when signal CLK goes to a digital "1" and the delayed signal CLKDBAR changes state, fourth transistor 240 remains off and continues to isolate second transistor 220 from first supply voltage 201. Consequently, second transistor 220 does not resist, compete or "fight" the discharge of node 290 to a digital "0" when there is a path 291 from node 290 to second supply voltage 206 through logic block 203 and third transistor 230.

Since, as shown above, according to the invention, second transistor 220 does not resist, compete or "fight" the discharge of node 290 when there is a path 291 from node 290 to second supply voltage 206 through logic block 203 and third transistor 230, circuit designers are free to use larger and more powerful second transistors 220. This, in turn, means that the high-speed domino logic with improved cascode keeper circuits 200, in contrast to prior art domino logic circuits, can be designed to have high noise immunity and increased speed.

Figure 1:
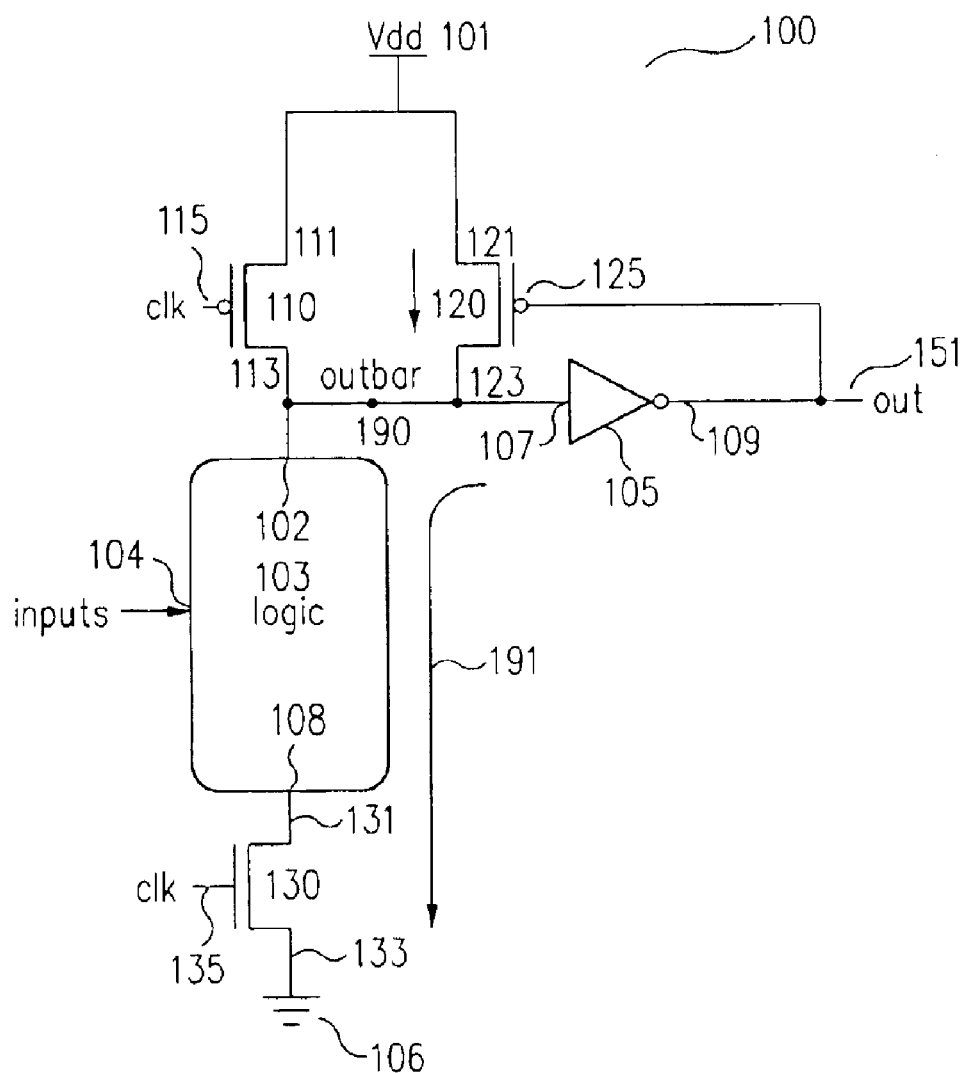
FIG. 1 shows a schematic diagram of a prior art domino logic circuit.

After the a time equal to the delay time introduced by inverter delay element 296, i.e., when signal CLKDBAR does transition to a digital "0", high-speed domino logic with improved cascode keeper circuit 200 operates in substantially the same manner as any other domino logic circuit, such as prior art domino logic circuit 100 in FIG. 1.

FIG. 3 is a one embodiment of a timing diagram for the high-speed domino logic with improved cascode keeper circuit of the invention shown in FIG. 2. Shown in FIG. 3 are: signal CLK 351; delayed signal CLKDBAR 355; signal 357, which is the signal on node 290 in FIG. 2; and signal out 367, which is the signal on high-speed domino logic with improved cascode keeper circuit OUT terminal 251 in FIG. 2.

In the discussion below, and in one embodiment of the invention, signal CLKDBAR 355 is one, three, five, or any odd number, inverter delay later than signal CLK 351, see FIG. 2 and inverter delay element 296. In addition, as is well known to those of skill in the art, the transistors (not shown) making up inverters 295, 297 and 299 can be sized such that they provide more or less delay as well. Consequently, the choice of an inverter delay element 296 having three inverters 295, 297 and 299, as shown in FIG. 2, was made solely for illustrative purposes.

Viewing FIG. 2 and FIG. 3 together, at time T0, i.e., point 301 and the beginning of a pre-charge phase, signal CLK 351 switches low; and signal CLKDBAR 355 remains low; signal 357, which is the signal on node 290 in FIG. 2, is high. Consequently, fourth transistor 240 of FIG. 2 is on, second transistor 220 of FIG. 2 is on, and third transistor 230 of FIG. 2 is off, and signal OUT 367, which is the signal on high-speed domino logic with improved cascode keeper circuit OUT terminal 251 in FIG. 2, is low.

At time T1, i.e., point 302 and the end of delay period 330 of the pre-charge phase, signal CLK 351 remains low; signal CLKDBAR 355 transitions to high; and signal 357, which is the signal on node 290 in FIG. 2 remains high. Consequently, fourth transistor 240 of FIG. 2 transitions to off and second transistor 220 of FIG. 2 is isolated from first supply voltage 201, third transistor 230 of FIG. 2 remains off, and signal out 367, which is the signal on high-speed domino logic with improved cascode keeper circuit out terminal 251 in FIG. 2, remains low.

At time T2, i.e., point 303 and the beginning of the transition delay period 331 from the pre-charge phase to the evaluation phase, signal CLK 351 transitions high; signal CLKDBAR 355 remains high; and signal 357, which is the signal on node 290 in FIG. 2 transitions low. Consequently, fourth transistor 240 in FIG. 2 remains off and second transistor 220 of FIG. 2 remains isolated form first supply voltage 201 in FIG. 2, third transistor 230 of FIG. 2 transitions to on and signal out 367, which is the signal on high-speed domino logic with improved cascade keeper circuit out terminal 251 in FIG. 2 transitions to high after an inverter delay time T2A 304.

At time T3, i.e., point 305 and the end of the transition delay period 331 from the pre-charge phase to the evaluation phase, signal CLK 351 remains high; signal CLKDBAR 355 transitions low; and signal 357, which is the signal on node 290 in FIG. 2 remains low; Consequently, fourth transistor 240 of FIG. 2 turns on and second transistor 220 of FIG. 2 is no longer isolated from first supply voltage 201 in FIG. 2, third transistor 230 of FIG. 2 remains on, and signal out 367, which is the signal on high-speed domino logic with improved cascade keeper circuit out terminal 251 in FIG. 2 remains high.

Noteworthy is the fact that during transition delay time 331, signal CLK 351 switches to high and signal CLKDBAR 355 remains high. Consequently, as discussed above, according to the invention, delayed clock signal CLKDBAR 355 is used in conjunction with fourth transistor 240 to avoid the fight between node 290 and second transistor 220. Since as shown in FIG. 3, the delayed clock signal CLKDBAR 355 remains high for a programmed delay time 331 while signal CLK 351 immediately transitions to a digital "1" at time T2, i.e., point 303 in FIG. 3. During this delay time 331 between when signal CLK 351 goes to a digital "1" and the delayed signal CLKDBAR 355 change state, second transistor 220 is isolated from first supply voltage 201 by fourth transistor 240 being off. Consequently, second transistor 220 does not resist, compete or "fight" the discharge of node 290 to a digital "0" when there is a path 291 from node 290 to second supply voltage 206 through logic block 203 and third transistor 230.

Since, as shown above, according to the invention, second transistor 220 does not resist, compete or "fight" the discharge of node 290 when there is a path 291 from node 290 to second supply voltage 206, through logic block 203 and third transistor 230, circuit designers are free to use larger and more powerful second transistors 220. This, in turn, means that the high-speed domino logic with improved cascade keeper circuits 200, in contrast to prior art domino logic circuits, can be designed to have high noise immunity and increased speed.

At time T4, i.e., point 307 and the end of the evaluation phase, signal CLK 351 transitions low; signal CLKDBAR 355 remains low; and signal 357, which is the signal on node 290 in FIG. 2 transitions high. Consequently, fourth transistor 240 remain on and second transistor 220 of FIG. 2 remains coupled to first supply voltage 201 in FIG. 2, third transistor 230 of FIG. 2 transitions off and signal out 367, which is the signal on high-speed domino logic with improved cascade keeper circuit out terminal 251 in FIG. 2 transitions low after an inverter delay T4A 308.

In addition, the process discussed above will repeat for each switching of the system clock. Those of skill in the art will further recognize that the choice of signal highs and signal lows was made arbitrarily in FIG. 3 for illustrative purposes only and that at other times, and in other embodiments of the invention, signal highs could be replaced with signal lows and vice-versa.

As discussed above, the present invention is directed to a method and apparatus for creating a high-speed domino logic with improved cascade keeper circuit that is capable of operation in both high speed and high noise environments.

Since, according to the invention, the second, or keeper, transistor does not resist, compete or "fight" the discharge of the first node when there is a path from the first node to the second supply voltage, through the logic block, circuit designers are free to use larger and more powerful second transistors. This, in turn, means that the high-speed domino logic with improved cascade keeper circuits of the invention, in contrast to prior art domino logic circuits, can be designed to have high noise immunity and increased speed.

In addition, since according to one embodiment of the invention, only one new inverter and one new transistor are required, the modification of the invention is space efficient and readily incorporated into existing designs.

The foregoing description of an implementation of the invention has been presented for purposes of illustration and description only, and therefore is not exhaustive and does not limit the invention to the precise form disclosed. Modifications and variations are possible in light of the above teachings or may be acquired from practicing the invention.

For example, for illustrative purposes specific embodiments of the invention were shown with specific transistors. However, the NFETs and PFETS shown in the figures can be readily exchanged for PFETs and NFETs by reversing the polarities of the supply voltages or by other well known circuit modifications.

Consequently, the scope of the invention is defined by the claims and their equivalents.

What is claimed is:

1. A high-speed domino logic with improved cascode keeper circuit comprising:
    a first supply voltage;
    a second supply voltage;
    a first clock signal;
    a high-speed domino logic with improved cascode keeper OUT terminal;
    an inverted and delayed first clock signal being approximately 180 degrees out of phase with said first clock signal and delayed with respect to said first clock signal by a predetermined time;
    a first transistor, said first transistor comprising a first transistor first flow electrode, a first transistor second flow electrode and a first transistor control electrode, said first supply voltage being coupled to said first transistor first flow electrode, said first clock signal being coupled to said first transistor control electrode, said first transistor second flow electrode being coupled to a first node, said first transistor having a first threshold voltage;
    a second transistor, said second transistor comprising a second transistor first flow electrode, a second transistor second flow electrode and a second transistor control electrode, said second transistor second flow electrode being coupled to said first node, said second transistor control electrode being coupled to said high-speed domino logic with improved cascode keeper OUT terminal, said second transistor having substantially said first threshold voltage;
    a logic block, said logic block comprising at least one logic block input terminal and a logic block output terminal;
    a third transistor, said third transistor comprising a third transistor first flow electrode, a third transistor second flow electrode and a third transistor control electrode, said third transistor first flow electrode being coupled to said logic block output terminal, said third transistor second flow electrode being coupled to said second supply voltage, said third transistor control electrode being coupled to said first clock signal;

a fourth transistor, said fourth transistor comprising a fourth transistor first flow electrode, a fourth transistor second flow electrode and a fourth transistor control electrode, said first supply voltage being coupled to said fourth transistor first flow electrode, said fourth transistor second flow electrode being coupled to second transistor first flow electrode, said fourth transistor control electrode being coupled to said inverted and delayed first clock signal;

an inverter, said inverter comprising an inverter input terminal and an inverter output terminal, said inverter input terminal being coupled to said first node, said inverter output terminal being coupled to said OUT terminal of said high-speed domino logic with improved cascode keeper circuit.

2. The high-speed domino logic with improved cascode keeper circuit of claim 1, wherein;

said logic block of said high-speed domino logic with improved cascode keeper circuit comprises logic gates.

3. The high-speed domino logic with improved cascode keeper circuit of claim 2, wherein;

said logic block of said high-speed domino logic with improved cascode keeper circuit comprises an AND gate.

4. The high-speed domino logic with improved cascode keeper circuit of claim 2, wherein;

said logic block of said high-speed domino logic with improved cascode keeper circuit comprises an OR gate.

5. The high-speed domino logic with improved cascode keeper circuit of claim 1, wherein;

said first supply voltage is Vdd and said second supply voltage is ground.

6. The high-speed domino logic with improved cascode keeper circuit of claim 5, wherein;

said first transistor, said second transistor, and said fourth transistor are PFETs.

7. The high-speed domino logic with improved cascode keeper circuit of claim 6, wherein;

said third transistor is an NFET.

8. A high-speed domino logic with improved cascode keeper circuit comprising:

a first supply voltage;

a second supply voltage;

a first clock signal;

a high-speed domino logic with improved cascode keeper OUT terminal;

an inverter delay element, said inverter delay element having an inverter delay element input terminal coupled to said first clock signal and an inverter delay element output terminal;

a first transistor, said first transistor comprising a first transistor first flow electrode, a first transistor second flow electrode and a first transistor control electrode, said first supply voltage being coupled to said first transistor first flow electrode, said first clock signal being coupled to said first transistor control electrode, said first transistor second flow electrode being coupled to a first node, said first transistor having a first threshold voltage;

a second transistor, said second transistor comprising a second transistor first flow electrode, a second transistor second flow electrode and a second transistor control electrode, said second transistor second flow electrode being coupled to said first node, said second transistor control electrode being coupled to said high-speed domino logic with improved cascode keeper OUT terminal, said second transistor having substantially said first threshold voltage;

a logic block, said logic block comprising at least one logic block input terminal and a logic block output terminal;

a third transistor, said third transistor comprising a third transistor first flow electrode, a third transistor second flow electrode and a third transistor control electrode, said third transistor first flow electrode being coupled to said logic block output terminal, said third transistor second flow electrode being coupled to said second supply voltage, said third transistor control electrode being coupled to said first clock signal;

a fourth transistor, said fourth transistor comprising a fourth transistor first flow electrode, a fourth transistor second flow electrode and a fourth transistor control electrode, said first supply voltage being coupled to said fourth transistor first flow electrode, said fourth transistor second flow electrode being coupled to second transistor first flow electrode, said fourth transistor control electrode being coupled to said inverter delay element output terminal;

an inverter, said inverter comprising an inverter input terminal and an inverter output terminal, said inverter input terminal being coupled to said first node, said inverter output terminal being coupled to said OUT terminal of said high-speed domino logic with improved cascode keeper circuit; wherein, an inverted and delayed first clock signal is coupled from said inverter delay element output terminal to said fourth transistor control electrode, said inverted and delayed first clock signal being approximately 180 degrees out of phase with said first clock signal and delayed with respect to said first clock signal by a predetermined time.

9. The high-speed domino logic with improved cascode keeper circuit of claim 8, wherein;

said inverter delay element comprises one inverter.

10. The high-speed domino logic with improved cascode keeper circuit of claim 8, wherein;

said inverter delay element comprises three inverters.

11. The high-speed domino logic with improved cascode keeper circuit of claim 8, wherein;

said inverter delay element comprises five inverters.

12. The high-speed domino logic with improved cascode keeper circuit of claim 8, wherein;

said inverter delay element comprises an odd number or inverters.

13. The high-speed domino logic with improved cascode keeper circuit of claim 8, wherein;

said logic block of said high-speed domino logic with improved cascode keeper circuit comprises logic gates.

14. The high-speed domino logic with improved cascode keeper circuit of claim 13, wherein;

said logic block of said high-speed domino logic with improved cascode keeper circuit comprises an AND gate.

15. The high-speed domino logic with improved cascode keeper circuit of claim 13, wherein;

said logic block of said high-speed domino logic with improved cascode keeper circuit comprises an OR gate.

16. The high-speed domino logic with improved cascode keeper circuit of claim 8, wherein;
   said first supply voltage is Vdd and said second supply voltage is ground.

17. The high-speed domino logic with improved cascode keeper circuit of claim 16, wherein;
   said first transistor, said second transistor, and said fourth transistor are PFETs.

18. The high-speed domino logic with improved cascode keeper circuit of claim 17, wherein;
   said third transistor is an NFET.

19. A high-speed domino logic with improved cascode keeper circuit comprising:
   a first supply voltage, said first supply voltage being VDD;
   a second supply voltage, said second supply voltage being ground;
   a first clock signal;
   a high-speed domino logic with improved cascode keeper OUT terminal;
   an inverter delay element, said inverter delay element having an inverter delay element input terminal coupled to said first clock signal and an inverter delay element output terminal, said inverter delay element comprising an odd number of inverters;
   a first transistor, said first transistor comprising a first transistor first flow electrode, a first transistor second flow electrode and a first transistor control electrode, said first supply voltage being coupled to said first transistor first flow electrode, said first clock signal being coupled to said first transistor control electrode, said first transistor second flow electrode being coupled to a first node, said first transistor having a first threshold voltage;
   a second transistor, said second transistor comprising a second transistor first flow electrode, a second transistor second flow electrode and a second transistor control electrode, said second transistor second flow electrode being coupled to said first node, said second transistor control electrode being coupled to said high-speed domino logic with improved cascode keeper OUT terminal, said second transistor having substantially said first threshold voltage;
   a logic block, said logic block comprising at least one logic block input terminal and a logic block output terminal;
   a third transistor, said third transistor comprising a third transistor first flow electrode, a third transistor second flow electrode and a third transistor control electrode, said third transistor first flow electrode being coupled to said logic block output terminal, said third transistor second flow electrode being coupled to said second supply voltage, said third transistor control electrode being coupled to said first clock signal;
   a fourth transistor, said fourth transistor comprising a fourth transistor first flow electrode, a fourth transistor second flow electrode and a fourth transistor control electrode, said first supply voltage being coupled to said fourth transistor first flow electrode, said fourth transistor second flow electrode being coupled to second transistor first flow electrode, said fourth transistor control electrode being coupled to said inverter delay element output terminal;
   an inverter, said inverter comprising an inverter input terminal and an inverter output terminal, said inverter input terminal being coupled to said first node, said inverter output terminal being coupled to said OUT terminal of said high-speed domino logic with improved cascode keeper circuit; wherein,
   an inverted and delayed first clock signal is coupled from said inverter delay element output terminal to said fourth transistor control electrode, said inverted and delayed first clock signal being approximately 180 degrees out of phase with said first clock signal and delayed with respect to said first clock signal by a predetermined time.

20. The high-speed domino logic with improved cascode keeper circuit of claim 19, wherein;
   said first transistor, said second transistor, and said fourth transistor are PFETs.

21. The high-speed domino logic with improved cascode keeper circuit of claim 20, wherein;
   said third transistor is an NFET.

* * * * *